US008230908B2

(12) United States Patent
Foster, Sr. et al.

(10) Patent No.: US 8,230,908 B2
(45) Date of Patent: *Jul. 31, 2012

(54) HEAT SINK FOR DISSIPATING A THERMAL LOAD

(75) Inventors: Jimmy G. Foster, Sr., Morrisville, NC (US); Donna C. Hardee, Raleigh, NC (US); Don S. Keener, Apex, NC (US); Robert R. Wolford, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 1011 days.

This patent is subject to a terminal disclaimer.

(21) Appl. No.: 11/326,565

(22) Filed: Jan. 5, 2006

(65) Prior Publication Data

US 2007/0151706 A1    Jul. 5, 2007

(51) Int. Cl.
*H05K 7/20* (2006.01)
(52) U.S. Cl. ............... 165/104.33; 257/715; 361/700
(58) Field of Classification Search ............. 165/80.4, 165/104.33; 257/714, 715; 361/699, 700
See application file for complete search history.

(56) References Cited

U.S. PATENT DOCUMENTS

| | | | |
|---|---|---|---|
| 4,682,651 A | 7/1987 | Gabuzda | |
| 5,265,321 A | 11/1993 | Nelson et al. | |
| 5,370,178 A | 12/1994 | Agonafer et al. | |
| 5,699,853 A * | 12/1997 | Goth et al. | 165/104.33 |
| 5,936,836 A | 8/1999 | Scholder | |
| 6,394,175 B1 | 5/2002 | Chen et al. | |
| 6,639,799 B2 | 10/2003 | Prasher et al. | |
| 6,704,199 B2 | 3/2004 | Wiley | |
| 6,712,128 B1 | 3/2004 | Dussinger et al. | |
| 6,717,813 B1 | 4/2004 | Garner | |
| 6,915,844 B2 * | 7/2005 | Chou | 165/104.33 |
| 6,938,682 B2 * | 9/2005 | Chen et al. | 165/104.33 |
| 6,964,295 B1 * | 11/2005 | Yu et al. | 165/104.33 |

(Continued)

FOREIGN PATENT DOCUMENTS

JP    57042154 A    3/1962

(Continued)

OTHER PUBLICATIONS

Eldridge & Petersen; Heat-Pipe Vapor Cooling Etched Silicon Structure; IBM Technical Disclosure Bulletin; Jan. 1983; pp. 4118-4119; vol. 25 No. 8; USA.

*Primary Examiner* — Leonard R Leo
(74) *Attorney, Agent, or Firm* — H. Barrett Spraggine; Cynthia G. Seal; Biggers & Ohanian, LLP

(57) ABSTRACT

A heat sink for dissipating a thermal load is disclosed that includes one or more heat sink bases configured around a central axis of the heat sink so as to define an interior space, at least one heat sink base receiving the thermal load, a thermal transport connected to the at least one heat sink base receiving the thermal load so as to distribute the thermal load in the heat sink, and heat-dissipating fins connected to each heat sink base, the heat-dissipating fins extending from each heat sink base into the interior space of the heat sink, each heat-dissipating fin shaped according to the location of the heat-dissipating fin with respect to the location of the thermal load and the location of the distributed thermal load in the heat sink.

2 Claims, 10 Drawing Sheets

U.S. PATENT DOCUMENTS

| | | | |
|---|---|---|---|
| 6,992,890 B2 * | 1/2006 | Wang et al. | 361/700 |
| 7,013,960 B2 * | 3/2006 | Lee et al. | 165/104.33 |
| 7,298,620 B2 * | 11/2007 | Wu | 361/700 |
| 7,312,994 B2 * | 12/2007 | Lee et al. | 361/700 |
| 2002/0139516 A1 * | 10/2002 | Zuo | 165/104.33 |
| 2007/0012428 A1 * | 1/2007 | Wu et al. | 165/104.33 |
| 2007/0095508 A1 * | 5/2007 | Xia et al. | 165/104.33 |
| 2007/0119583 A1 * | 5/2007 | Foster et al. | 165/104.33 |
| 2007/0137838 A1 * | 6/2007 | Foster et al. | 165/104.33 |
| 2007/0151712 A1 * | 7/2007 | Foster et al. | 165/104.33 |

FOREIGN PATENT DOCUMENTS

| | | |
|---|---|---|
| JP | 8306836 A | 11/1996 |
| JP | 11118372 A | 4/1999 |
| JP | 2002318084 A | 10/2002 |
| JP | 2003115685 A | 4/2003 |
| NL | 9400082 A | 9/1995 |
| WO | WO03065775 A2 | 8/2003 |

* cited by examiner

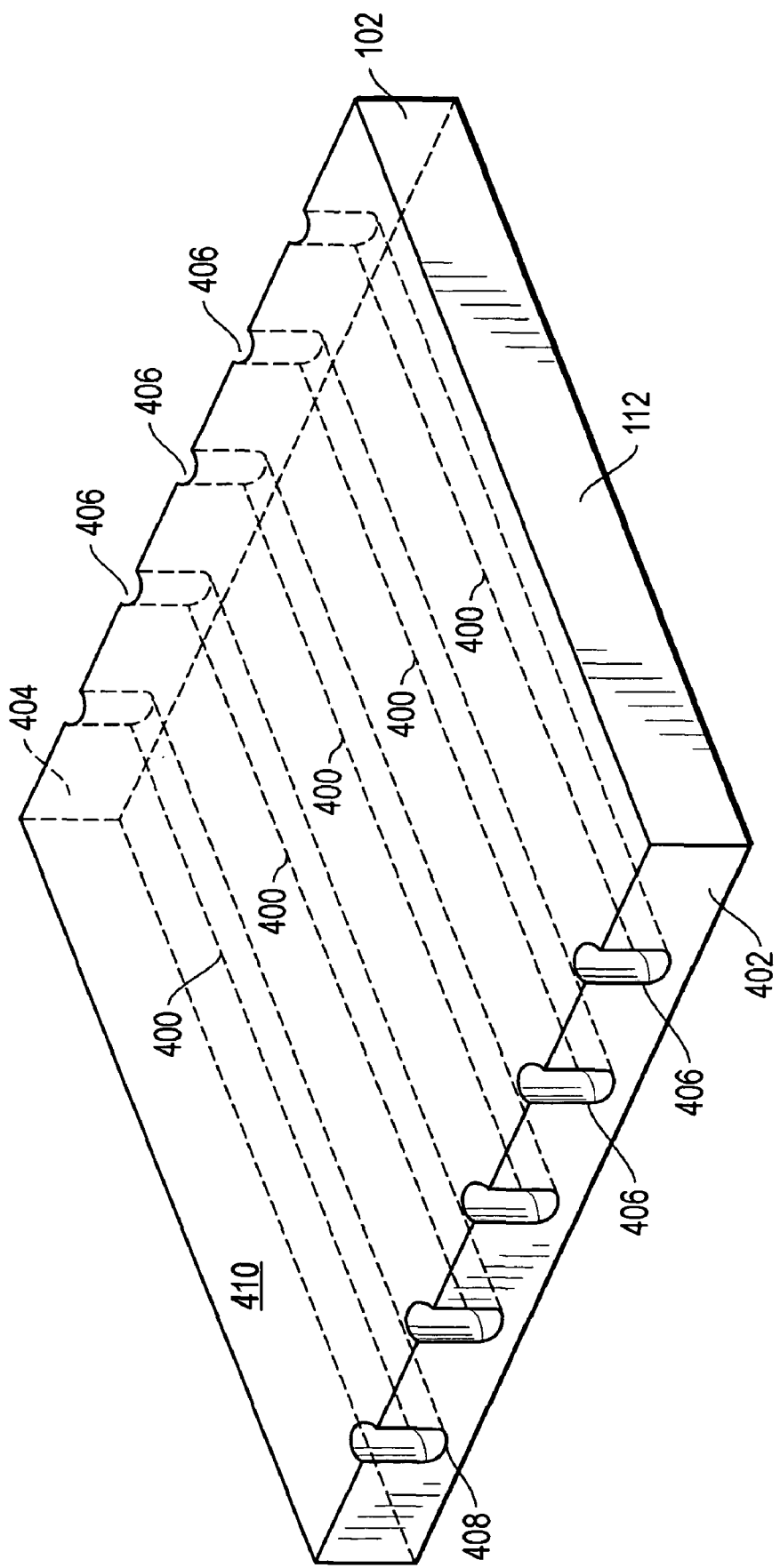

HEAT SINK FOR DISSIPATING A THERMAL LOAD

BACKGROUND OF THE INVENTION

1. Field of the Invention

The field of the invention is heat sinks for dissipating a thermal load.

2. Description of Related Art

The development of the EDVAC computer system of 1948 is often cited as the beginning of the computer era. Since that time, users have relied on computer systems to simplify the process of information management. Today's computer systems are much more sophisticated than early systems such as the EDVAC. Such modem computer systems deliver powerful computing resources to provide a wide range of information management capabilities through the use of computer software such as database management systems, word processors, spreadsheets, client/server applications, web services, and so on.

In order to deliver powerful computing resources, computer architects must design powerful computer processors. Current computer processors, for example, are capable of executing billions of computer program instructions per second. Operating these computer processors requires a significant amount of power, and often such processors can consume over 100 watts. Consuming significant amounts of power generates a considerable amount of heat. Unless the heat is removed, heat generated by a computer processor may degrade or destroy the processor's functionality.

To prevent the degradation or destruction of a computer processor, a computer architect may remove heat from the processor by using heat sinks. Current heat sinks, however, only provide one or two cooling surfaces with attached fins for dissipating the heat absorbed by the heat sinks. Such heat sinks are often unable to remove the heat necessary to prevent damage to today's computer processors because physical limitations of the enclosure containing the processor may prevent a system designer from designing cooling surface large enough or fins tall enough to dissipate the required amount of heat from the processor. In addition, physical limitations of the enclosure for the processor often prevent the system architect from centrally locating a computer processor under a heat sink for even distribution of the heat generated by the processor. Because the heat source is not centrally located at the heat sink, a computer architect must design a larger heat sink to remove the same amount of heat had the processor been centrally located under the heat sink. Combining a fan with a heat sink may improve the ability to remove heat from the computer processor, but often a computer architect is unable to implement such a combination because combining a fan with the heat sink only increases the physical space required inside the enclosure containing the processor.

SUMMARY OF THE INVENTION

A heat sink for dissipating a thermal load is disclosed that includes one or more heat sink bases configured around a central axis of the heat sink so as to define an interior space, at least one heat sink base receiving the thermal load, a thermal transport connected to the at least one heat sink base receiving the thermal load so as to distribute the thermal load in the heat sink, and heat-dissipating fins connected to each heat sink base, the heat-dissipating fins extending from each heat sink base into the interior space of the heat sink, each heat-dissipating fin shaped according to the location of the heat-dissipating fin with respect to the location of the thermal load and the location of the distributed thermal load in the heat sink.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 4 sets forth a perspective view of an exemplary heat sink base useful in a heat sink for dissipating a thermal load according to embodiments of the present invention.

DETAILED DESCRIPTION OF EXEMPLARY EMBODIMENTS

Figure 1:
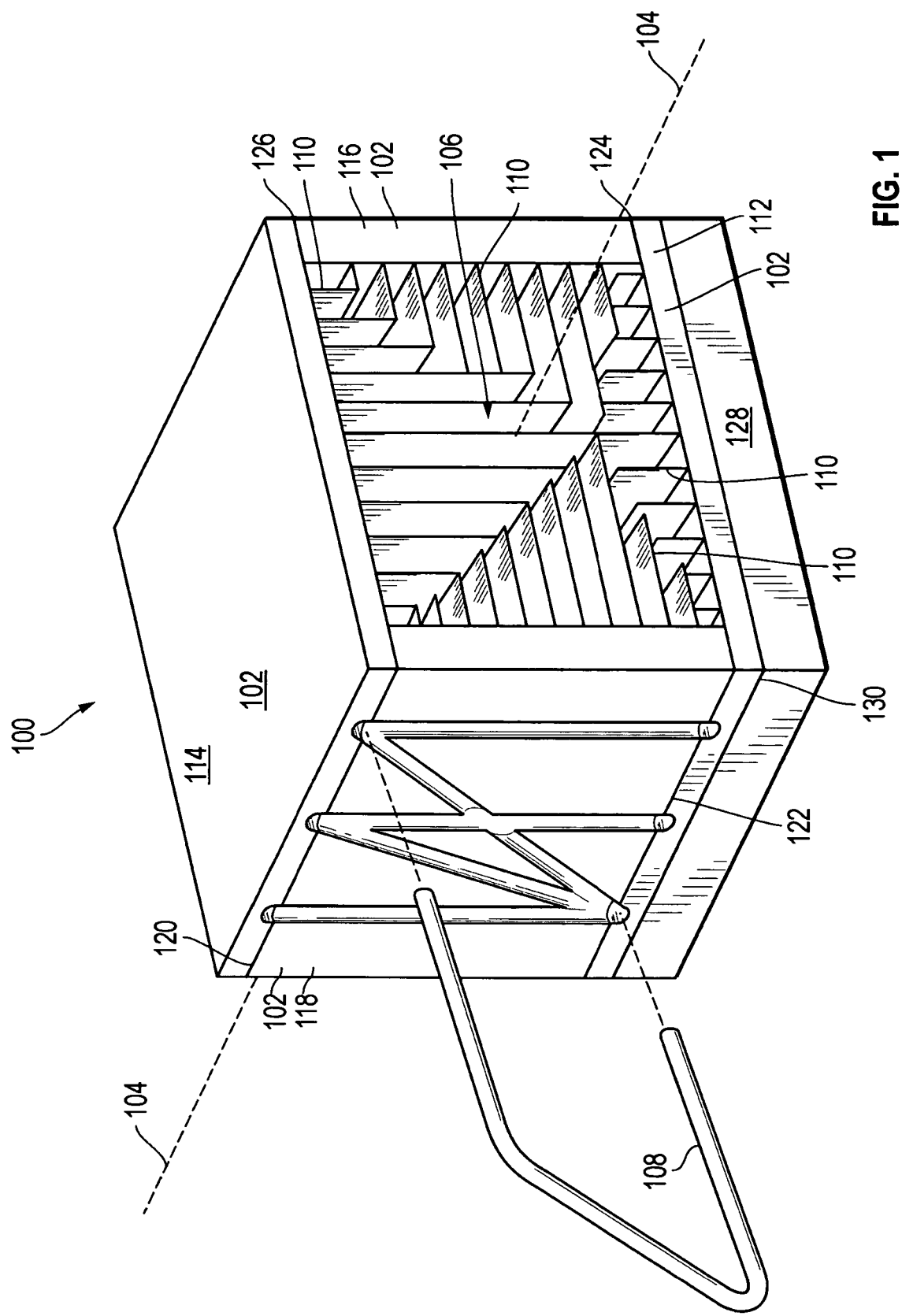
FIG. 1 sets forth a perspective view of an exemplary heat sink for distributing a thermal load according to embodiments of the present invention.

Exemplary heat sinks for dissipating a thermal load according to embodiments of the present invention are described with reference to the accompanying drawings, beginning with FIG. 1. FIG. 1 sets forth a perspective view of an exemplary heat sink (100) for distributing a thermal load according to embodiments of the present invention. The thermal load is the rate of thermal energy produced over time from the operation of an integrated circuit package (128) such as, for example, a computer processor or memory chip. A measure of thermal load is typically expressed in units of Watts.

In the example of FIG. 1, the heat sink (100) is a thermal conductor configured to absorb and dissipate the thermal load from the integrated circuit package (128) thermally connected with the heat sink (100). Thermal conductors used in designing the heat sink (100) may include, for example, aluminum, copper, silver, aluminum silicon carbide, or carbon-based composites. Heat sink (100) absorbs the thermal load from the integrated circuit package through thermal conduction. When thermally connecting the heat sink (100) to the integrated circuit package (128), the heat sink provides additional thermal mass, cooler than the integrated circuit package (128), into which the thermal load may flow. After absorbing the thermal load, the heat sink (100) dissipates the thermal load through thermal convection and thermal radiation into the air surrounding the heat sink (100). Increasing the surface area of the heat sink (100) typically increases the rate of dissipating the thermal load. The surface area of the heat sink (100) may be increased by enlarging a base of the heat sink or increasing the number of heat-dissipating fins.

Heat sink (100) in the example of FIG. 1 connects to the integrated circuit package (128) by a thermal interface (130). The thermal interface (130) is a thermally conductive material that reduces the thermal resistance associated with transferring the thermal load from the integrated circuit package (128) to the heat sink (100). The thermal interface (130) between the integrated circuit package (128) and the heat sink (100) has less thermal resistance than could typically be produced by connecting the integrated circuit package (128) directly to the heat sink (100). Decreasing the thermal resistance between the integrated circuit package (128) and the heat sink (100) increases the efficiency of transferring the thermal load from the integrated circuit package (128) to the heat sink (100). The thermal interface (130) in the example of FIG. 1 may include non-adhesive materials such as, for example, thermal greases, phase change materials, and gap-filling pads. The thermal interface (130) may also include adhesive materials such as, for example, thermosetting liquids, pressure-sensitive adhesive ('PSA') tapes, and thermoplastic or thermosetting bonding films.

The example heat sink (100) of FIG. 1 includes one or more heat sink bases (102) configured around a central axis (104) of the heat sink so as to define an interior space (106). At least one heat sink base (102) receives the thermal load from the integrated circuit package (128). The one or more heat sink bases (102) in the example of FIG. 1 include a bottom plate (112), a top plate (114), a right plate (116), and a left plate (118). The plates are connected along edges (120, 122, 124, and 126) and oriented around the central axis (104) of the heat sink so as to define the interior space (106) as a rectangular box shape with four closed sides and two open sides. In the example of FIG. 1, the right plate (116) connects with the bottom plate (112) along edges (124) using a thermal interface. Edges (124) are the upper-rightmost edge of the bottom plate (112) and the lower-rightmost edge of the right plate (116). The left plate (118) connects with the bottom plate (112) along edges (122) using a thermal interface. Edges (122) are the upper-leftmost edge of the bottom plate (112) and the lower-leftmost edge of the left plate (118). The right plate (116) connects with the top plate (114) along edges (126) using a thermal interface. Edges (126) are the lower-rightmost edge of the upper plate (114) and the upper-rightmost edge of the right plate (116). The left plate (118) connects with the top plate (114) along edges (120) using a thermal interface. Edges (120) are the lower-leftmost edge of the upper plate (114) and the upper-leftmost edge of the left plate (118). In the example of FIG. 1, the bottom plate (112) connects to the integrated circuit package (128) to receive the thermal load for distribution in the heat sink.

The example heat sink (100) of FIG. 1 includes a thermal transport (108) connected to the at least one heat sink base (102) receiving the thermal load so as to distribute the thermal load in the heat sink (100). The thermal transport (108) in the example of FIG. 1 is a heat transfer mechanism that transports thermal energy from one region along the thermal transport to another region along the thermal transport with a minimal loss of thermal energy. Such thermal transports have an efficiency that approximates a closed thermal transfer system. The thermal transport (108) transports thermal energy by absorbing the thermal energy from one region along the thermal transport and releasing the thermal energy at another region along the thermal transport. Examples of thermal transports include heat pipes and carbon nanotubes.

The example heat sink (100) of FIG. 1 includes heat-dissipating fins (110) connected to each heat sink base (102). The heat-dissipating fins (110) are thermal conductors that provide additional surface area to heat sink (100) for dissipating the thermal load. The heat-dissipating fins (110) dissipate the thermal load into the environment adjacent the surfaces of the heat-dissipating fins (110). Each heat-dissipating fin (110) is shaped according to the location of the heat-dissipating fin with respect to the location of the thermal load and the location of the distributed thermal load in the heat sink. The heat-dissipating fins (110) extend from each heat sink base (102) into the interior space (106) of the heat sink (100). The heat-dissipating fins (110) connect to each heat sink base (102) by extrusion. The extruded heat-dissipating fins (110) in the example of FIG. 1 are for explanation only, and not for limitation. The heat-dissipating fins (110) may also connect to each heat sink base (102) by bonding the heat-dissipating fins (110) to each heat sink base (102) through the use of epoxy, press-fit, brazing, welding, or other connections as may occur to those of skill in the art.

Figure 2:
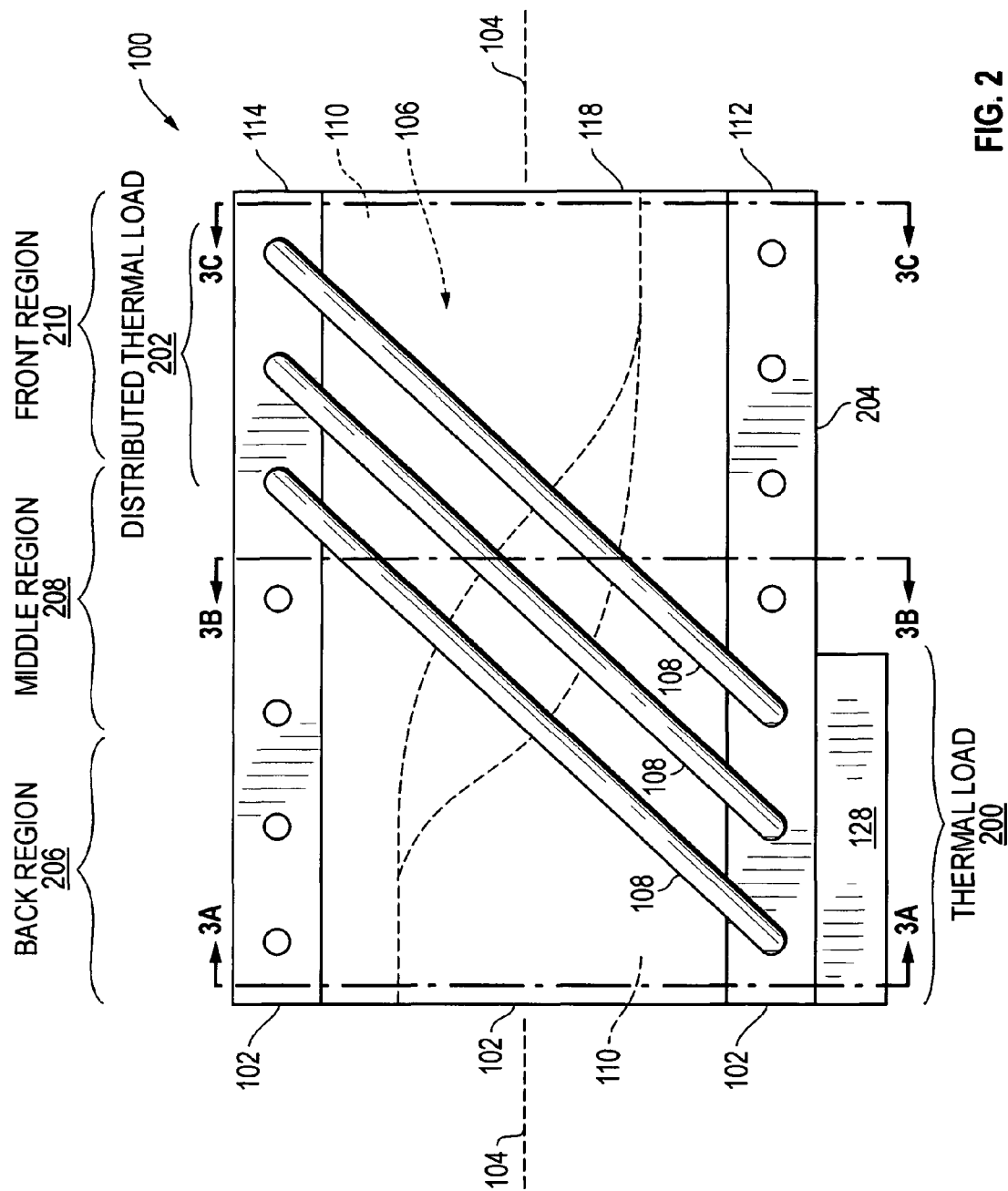
FIG. 2 sets forth a left side view of a further exemplary heat sink for dissipating a thermal load according to embodiments of the present invention.

For further explanation regarding the thermal load and the distributed thermal load, FIG. 2 sets forth a left side view of a further exemplary heat sink (100) for dissipating a thermal load (200) according to embodiments of the present invention. The example heat sink (100) of FIG. 2 includes one or more heat sink bases (102) configured around a central axis (104) of the heat sink so as to define an interior space (106). At least one heat sink base (102) receives the thermal load from the integrated circuit package (128). The one or more heat sink bases (102) in the example of FIG. 2 include a bottom plate (112), a top plate (114), a right plate (not shown), and a left plate (118). The plates are connected along edges and oriented around the central axis (104) of the heat sink (100) so as to define the interior space (106) as a rectangular box shape with four closed sides and two open sides. The plates are connected in a manner similar to the plates in the example of FIG. 1.

In the example of FIG. 2, the bottom plate (112) connects to an integrated circuit package (128) to receive a thermal load for distribution in a heat sink. The bottom plate (112) connects to the integrated circuit package (128) along the back region (206) of the lower surface (204) of the bottom plate (112). The bottom plate (112) may connect to the integrated circuit package (128) at the back region (206) of the lower surface (204) of the bottom plate (112) because physical limitations of a heat sink environment prohibit centering the integrated circuit package (128) along the lower surface (204) of the bottom plate (112). Connecting the bottom plate (112) to the integrated circuit package (128) along the back region (206) of the lower surface (204) of the bottom plate (112) concentrates the thermal load (200) in the back region (206) of the bottom plate (112). In other embodiments where the bottom plate (112) connects to the integrated circuit package (128) along the entire lower surface (204), the thermal load (200) may still be concentrated in one region of the bottom plate (112) when the integrated circuit package (128) unevenly generates the thermal load.

The example of FIG. 2 includes thermal transports (108) connected to the at least one heat sink base (102) receiving the thermal load (200) so as to distribute the thermal load (200) in the heat sink (100). The thermal transports (108) in the example of FIG. 2 connect between the bottom plate (112)

receiving the thermal load (200), the left plate (118), and the top plate (114) so as to distribute the thermal load in the heat sink (100). Similar thermal transports (not shown) connect between the between the bottom plate (112) receiving the thermal load (200), the right plate (not shown), and the top plate (114) so as to distribute the thermal load in the heat sink (100). As mentioned above, each thermal transport (108) distributes the thermal load (200) in the heat sink (100) by absorbing the thermal energy from one region along the thermal transport (108) and releasing the thermal energy at another region along the thermal transport (108). A distributed thermal load is the rate of thermal energy released by a thermal transport (108) into a region of a heat sink base (102) adjacent to the thermal transport (108). A measure of the distributed thermal load is typically expressed in units of Watts. In the example of FIG. 2, the distributed thermal load (202) in the top plate (114) is the rate of thermal energy released by the thermal transports (108) into the top plate (114). A distributed thermal load (not shown) in the left plate (118) is the rate of thermal energy released by the thermal transports (108) into of the left plate (118). A distributed thermal load (not shown) in the right plate (not shown) is the rate of thermal energy released by the thermal transports (108) into of the right plate (not shown).

The example of FIG. 2 also includes heat-dissipating fins (110) connected to each heat sink base (102). The heat-dissipating fins (110) extend from each heat sink base (102) into the interior space (106) of the heat sink (100). Each heat-dissipating fin (110) is shaped according to the location of the heat-dissipating fin (110) with respect to the location of the thermal load (200) and the location of the distributed thermal load (202) in the heat sink (100). The location of the thermal load (200) is the region of a heat sink base (102) receiving the thermal load (200). The location of the distributed thermal load is a region of a heat sink base (102) receiving a distributed thermal load. Because of the relationship between the location of the heat-dissipating fins (110) connected to each heat sink base (102), the location of the thermal load (200), and the location of the distributed thermal loads (202), the heat-dissipating fins (110) connected to one heat sink base (102) may be shaped to have a different surface area in a particular region of the interior space (106) than the heat-dissipating fins (110) connected to another heat sink base (102) in the same region of the interior space (106). By shaping the heat-dissipating fins (110) according to the locations of the fins with respect to the thermal load and the distributed thermal load, the heat-dissipating fins (110) may provide more surface area for dissipating the thermal load (200) to a heat sink base (102) at regions of the heat sink base (102) receiving the thermal load (200) or a distributed thermal load (202).

For further explanation of shaping heat-dissipating fins according to the locations of the fins with respect to the thermal load and the distributed thermal load, consider the following three examples regarding heat-dissipating fins (110) shaped according to the location of the heat-dissipating fins (110) with respect to the location of the thermal load (200) and the location of the distributed thermal load (202) in the heat sink (100). In a first example of shaping heat-dissipating fins according to the locations of the fins with respect to the thermal load and the distributed thermal load, consider the back region (206) of the heat sink (100). In the example of FIG. 2, the thermal load (200) is located in the back region (206) of the bottom plate (112). The heat-dissipating fins (110) connected to the bottom plate (112) therefore are shaped to have more surface area in the back region (206) of the interior space (106) than the surface area of the heat-dissipating fins (110) connected to the top plate (114), the left plate (118), and the right plate (not shown) in the back region (206) of the interior space (106).

Figure 3A:
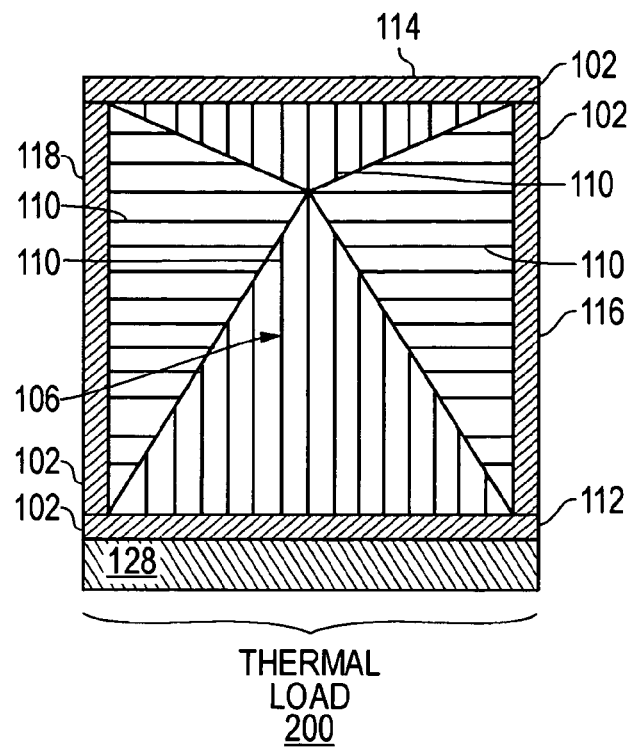
FIG. 3A sets forth a cross-sectional view of section '3A-3A' of the example heat sink of FIG. 2.

For further explanation of the shape of the heat-dissipating fins (110) in the back region (206) of the heat sink (100), FIG. 3A sets forth a cross-sectional view of section '3A-3A' of the example heat sink (100) of FIG. 2. In the cross-sectional view of FIG. 3A, the bottom plate (112) in the back region of the heat sink receives a relatively larger thermal load (200) from the integrated circuit package (128) than the thermal load and distributed thermal load received by the top plate (114), left plate (118), and the right plate (116) in the back region of the heat sink. The heat-dissipating fins (110) connected to the bottom plate (112) therefore are shaped to have more surface area than the surface area of the heat-dissipating fins (110) connected to the top plate (114), the left plate (118), or the right plate (116). To provide more surface area to the fins (110) connected to the bottom plate (112), the heat-dissipating fins (110) connected to the bottom plate (112) extend from the bottom plate (112) farther into the interior space (106) than the distances that the heat-dissipating fins (110) connected the other heat sink bases (102) extend from the other heat sink bases (102) into the interior space (106).

Now turning back to FIG. 2: In a second example of shaping heat-dissipating fins according to the locations of the fins with respect to the thermal load and the distributed thermal load, consider the middle region (208) of the heat sink (100). In the example of FIG. 2, thermal transports (108) traverse the left plate (118) and the right plate, distributing the thermal load to the left plate and the right plate (116 on FIG. 3B in addition to distributing the thermal load to the top plate (114). In the example of FIG. 2, therefore, a distributed thermal load is located in the middle region (208) of the left plate (118) and the right plate (116 on FIG. 3B) as well as being located also in the top plate (114). The heat-dissipating fins (110) connected to the left plate (118) and the right plate (116 on FIG. 3B) therefore are shaped to have more surface area in the middle region (208) of the interior space (106) than the surface area of the heat-dissipating fins (110) connected to the top plate (114) and the bottom plate (112) in the middle region (208) of the interior space (106).

Figure 3B:
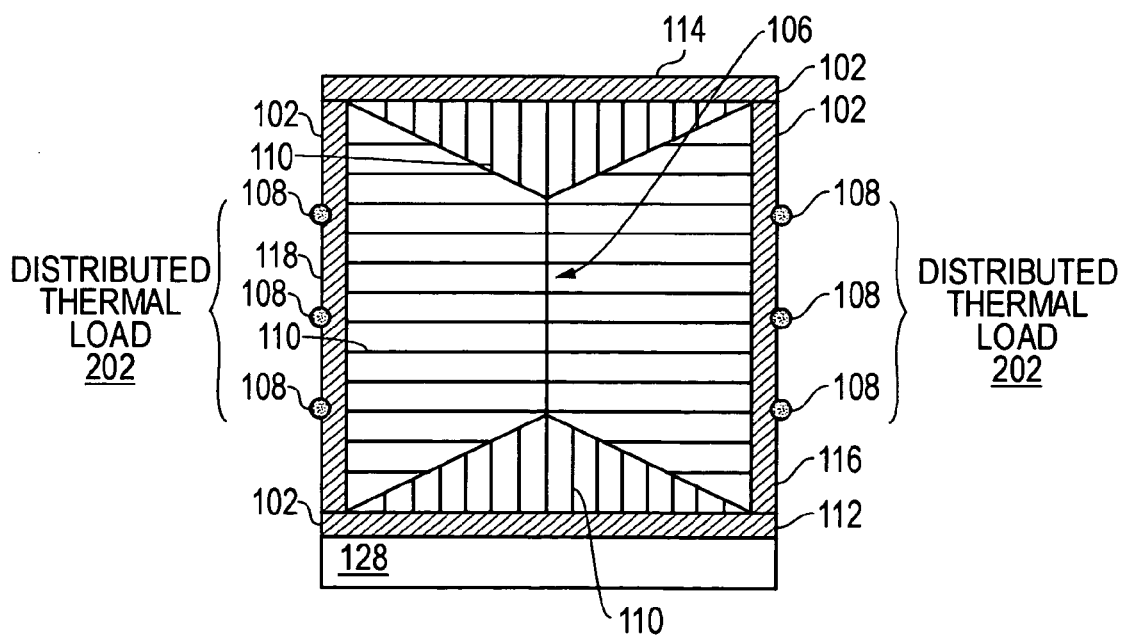
FIG. 3B sets forth a cross-sectional view of section '3B-3B' of the example heat sink of FIG. 2.

For further explanation of the shape of the heat-dissipating fins (110) in the middle region (208) of heat sink (100), FIG. 3B sets forth a cross-sectional view of section '3B-3B' of the example heat sink (100) of FIG. 2. In the cross-sectional view of FIG. 3B, the left plate (118) and the right plate (116) in the middle region of the heat sink receive a relatively larger distributed thermal load (202) from the thermal transports (108) than the thermal load and the distributed thermal load received by the bottom plate (112) and the top plate (114) in the middle region of the heat sink. The heat-dissipating fins (110) connected to the left plate (118) and the right plate (116) therefore are shaped to have more surface area than the surface area of the heat-dissipating fins (110) connected to the top plate (114) or the bottom plate (112). To provide more surface area to the fins (110) connected to the left plate (118) and the right plate (116), the heat-dissipating fins (110) connected to the left plate (118) and the right plate (116) extend respectively from the left plate (118) and the right plate (116) farther into the interior space (106) than the distances that the heat-dissipating fins (110) connected the other heat sink bases (102) extend from the other heat sink bases (102) into the interior space (106).

Again with reference to FIG. 2: In a third example of shaping heat-dissipating fins according to the locations of the fins with respect to the thermal load and the distributed thermal load, consider the front region (210) of the heat sink (100). In the example of FIG. 2, the distributed thermal load (202) is located in the front region (210) of the top plate (114). The heat-dissipating fins (110) connected to the top plate (114) therefore are shaped to have more surface area in the front region (210) of the interior space (106) than the surface area of the heat-dissipating fins (110) connected to the bottom plate (112), the left plate (118), and the right plate (not shown) in the front region (210) of the interior space (106).

Figure 3C:
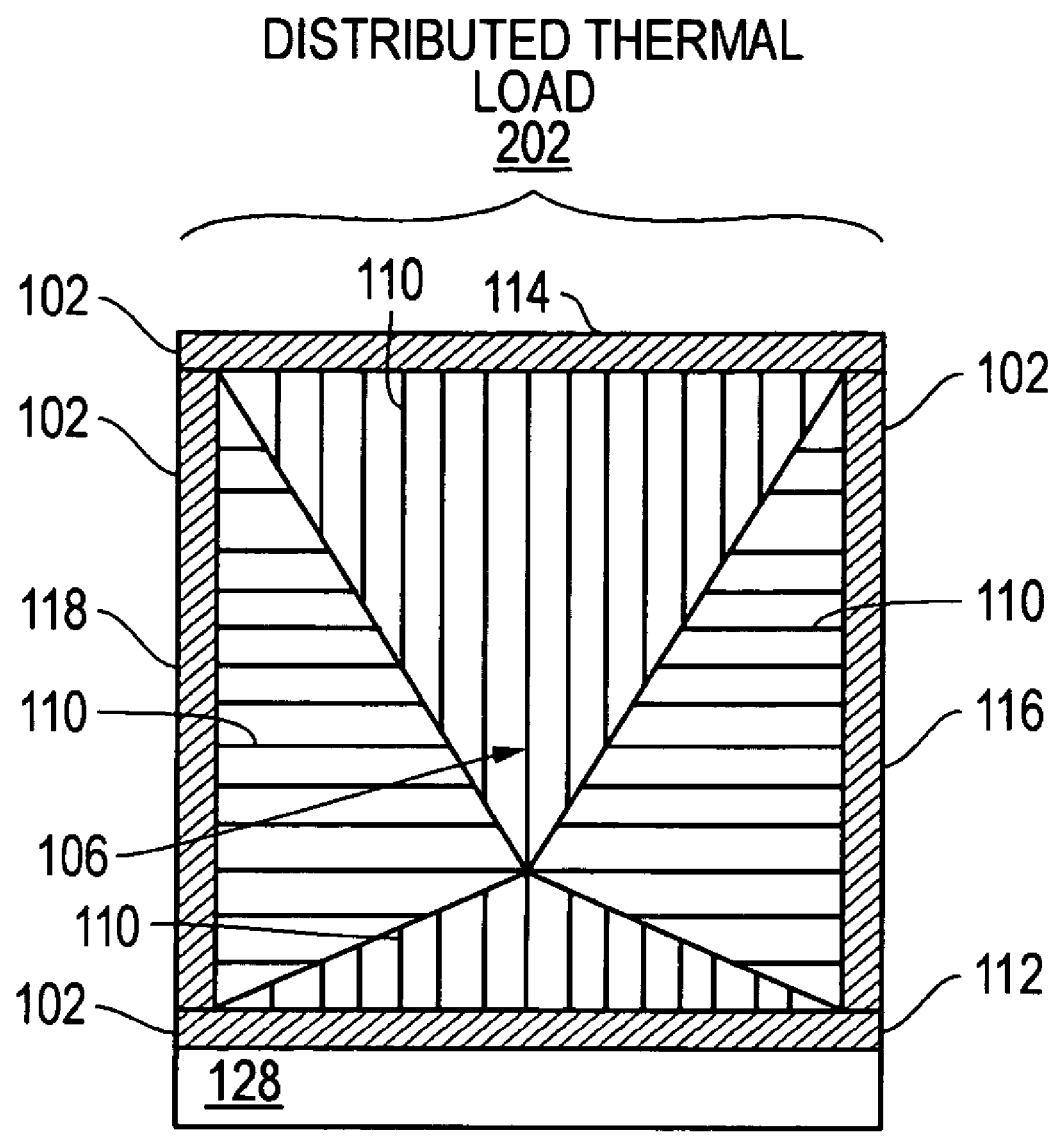
FIG. 3C sets forth a cross-sectional view of section '3C-3C' of the example heat sink of FIG. 2.

For further explanation of the shape of the heat-dissipating fins (110) in the front region (210) of the heat sink (100), FIG. 3C sets forth a cross-sectional view of section '3C-3C' of the example heat sink (100) of FIG. 2. In the cross-sectional view of FIG. 3C, the top plate (114) in the front region of the heat sink receives a relatively larger distributed thermal load (202) from the thermal transports than the thermal load and distributed thermal load received by the bottom plate (112), left plate (118), and the right plate (116) in the front region of the heat sink. The heat-dissipating fins (110) connected to the top plate (114) therefore are shaped to have more surface area than the surface area of the heat-dissipating fins (110) connected to the bottom plate (112), the left plate (118), or the right plate (116). To provide more surface area to the fins (110) connected to the top plate (114), the heat-dissipating fins (110) connected to the top plate (114) extend from the top plate (114) farther into the interior space (106) than the distances that the heat-dissipating fins (110) connected the other heat sink bases (102) extend from the other heat sink bases (102) into the interior space (106).

In the example heat sink depicted in cross-sectional views of FIGS. 3A, 3B, and 3C, the heat-dissipating fins (110) are thermal conductors that provide additional surface area to heat sink (100) for dissipating the thermal load. The heat-dissipating fins, however, provide the additional surface area to the heat sink where each heat-dissipating fin connects to a heat sink base (102). The heat-dissipating fins (110) connected to a heat sink base (102) at a region of the heat sink receiving a thermal load therefore dissipate more of the thermal load than the heat-dissipating fins (110) connected to a heat sink base (102) at regions of the heat sink other than the region receiving the thermal load. By using a thermal transport to distribute the thermal load in the heat sink, not only are regions of the heat sink receiving the thermal load, but other regions of the heat sink are receiving the distributed thermal load. With more heat-dissipating fins (110) connected to heat sink bases (102) at regions of the heat sink receiving both the thermal load and the distributed thermal load than the number of heat-dissipating fins (110) connected to heat sink bases (102) at regions of the heat sink receiving the thermal load alone, the heat-dissipating fins (110) of a heat sink with thermal transports therefore more efficiently dissipate the thermal load than heat-dissipating fins (110) of a heat sink without thermal transports.

Shaping a heat-dissipating fin according to the location of the heat-dissipating fin with respect to the location of the thermal load and the location of the distributed thermal load in the heat sink may be carried out according to:

$$dQ/dt = h * A * dT,$$

where Q is the instantaneous thermal energy in the fin, dQ/dt is the rate of dissipation of thermal energy by the fin expressed in Watts, h is thermal conductivity of the fin expressed in Watts/meters$^2$/Kelvin, A is the surface area of the fin, and dT is the differential temperature of the fin minus the temperature of the air surrounding the fin. Distributing the thermal load in the heat sink with a thermal transport connected to the heat sink base receiving the thermal load according to embodiments of the present invention may increase overall heat sink capacity by as much as twenty percent. Shaping heat-dissipating fins according to the location of the heat-dissipating fin with respect to the location of the thermal load and the location of the distributed thermal load according to embodiments of the present invention may improve overall heat sink capacity by approximately an additional ten to fifteen percent.

In the example heat sink depicted in the cross-sectional views of FIGS. 3A, 3B, and 3C, the heat-dissipating fins (110) connect to each heat sink base (102) by extrusion from each heat sink base (102). As mentioned above, extruded heat-dissipating fins are for explanation, and not for limitation. The heat-dissipating fins (110) may also connect to each heat sink base (102) by bonding the fins (110) to the heat sink base (102) through the use of epoxy, brazing, or welding. The heat-dissipating fins (110) depicted in the cross-sectional views of FIGS. 3A, 3B, and 3C extend from each heat sink base (102) into the interior space (106) of the heat sink. The heat-dissipating fins (110) are spaced apart in parallel and extend in length from the front surface of the heat sink to the back surface of the heat sink.

In the example heat sink depicted in the cross-sectional views of FIGS. 3A, 3B, and 3C, manufacturing capabilities may restrict the thickness of the heat-dissipating fins (110) and number of heat-dissipating fins (110) connected to each heat sink base (102). While thinner fins and smaller gaps between fins may allow a heat sink designer to place more fins in a particular interior space, thinner fins and smaller gaps between fins may also limit the height of the fins. Extruded heat-dissipating fins (110) in the example heat sink depicted in the cross-sectional views of FIGS. 3A, 3B, and 3C typically have fin height-to-gap aspect ratios of up to 6 and a minimum fin thickness of 1.3 millimeters. Special die design features may however increase the height-to-gap aspect ratio to 10 and decrease the minimum fin thickness to 0.8 millimeters. For example, given a maximum heat-dissipating fin (110) height of 30 millimeters and a fin height-to-gap aspect ratio of 6, the minimum gap between heat-dissipating fins (110) is calculated as follows:

$$G = H \div R = 30 \div 6 = 5 \text{ millimeters}$$

where G is the gap between the heat-dissipating fins, H is the height of the heat-dissipating fins, and R is the fin height-to-gap aspect ratio.

After obtaining the minimum gap between fins (110), the number of heat-dissipating fins (110) is calculated as the quantity of the width of the plate plus the gap between fins divided by the quantity of the fin thickness plus the gap. Continuing with the previous example, given a heat sink base (102) width of 60 millimeters and a fin thickness of 1.3 millimeters, the number of heat-dissipating fins (110) connected the heat sink base (102) is calculated as follows:

$$N = (W+G) \div (T+G) = (60+5) \div (5+1.3) = 10.3 \text{ fins}$$

where N is the number of heat-dissipating fins that a plate may accommodate, W is the width of the plate, G is the gap between the heat-dissipating fins, and T is the thickness of the heat-dissipating fins. This calculation for the number of fins yields 10.3 fins, meaning that in this example, the plate may accommodate 10 fins.

For further explanation of a heat sink base (102), FIG. 4 sets forth a perspective view of an exemplary heat sink base (102) useful in a heat sink for dissipating a thermal load according to embodiments of the present invention. The heat sink base (102) in the example of FIG. 4 is implemented as a bottom plate (112). In the example of FIG. 4, the bottom plate (112) includes lower heat pipe tunnels (400). The lower heat pipe tunnels (400) receive heat pipes through the bottom plate (112). In the example of FIG. 4, the heat-dissipating fins are omitted for explanation and clarity.

The lower heat pipe tunnels (400) are circular tunnels that extend through the bottom plate (112) from the left surface (402) of the bottom plate (112) to the right surface (404) of the bottom plate (112). The diameters of the lower heat pipe tunnels (400) conform to the diameters of the heat pipes received by the lower heat pipe tunnels (400). In the example of FIG. 4, the lower heat pipe tunnels (400) are spaced equally apart in parallel.

The example of FIG. 4 also includes semicircular cavities (406) along the left surface (402) of the bottom plate (112) and along the right surface (404) of the bottom plate (112). The diameters of the semicircular cavities (406) conform to the diameters of the lower heat pipe tunnels (400). Each semicircular cavity (406) intersects one of the lower heat pipe tunnels (400). In the example of FIG. 4, each semicircular cavity (406) extends from the bottom (408) of a lower heat pipe tunnel (400) to the upper surface (410) of the bottom plate (112).

Figure 5:
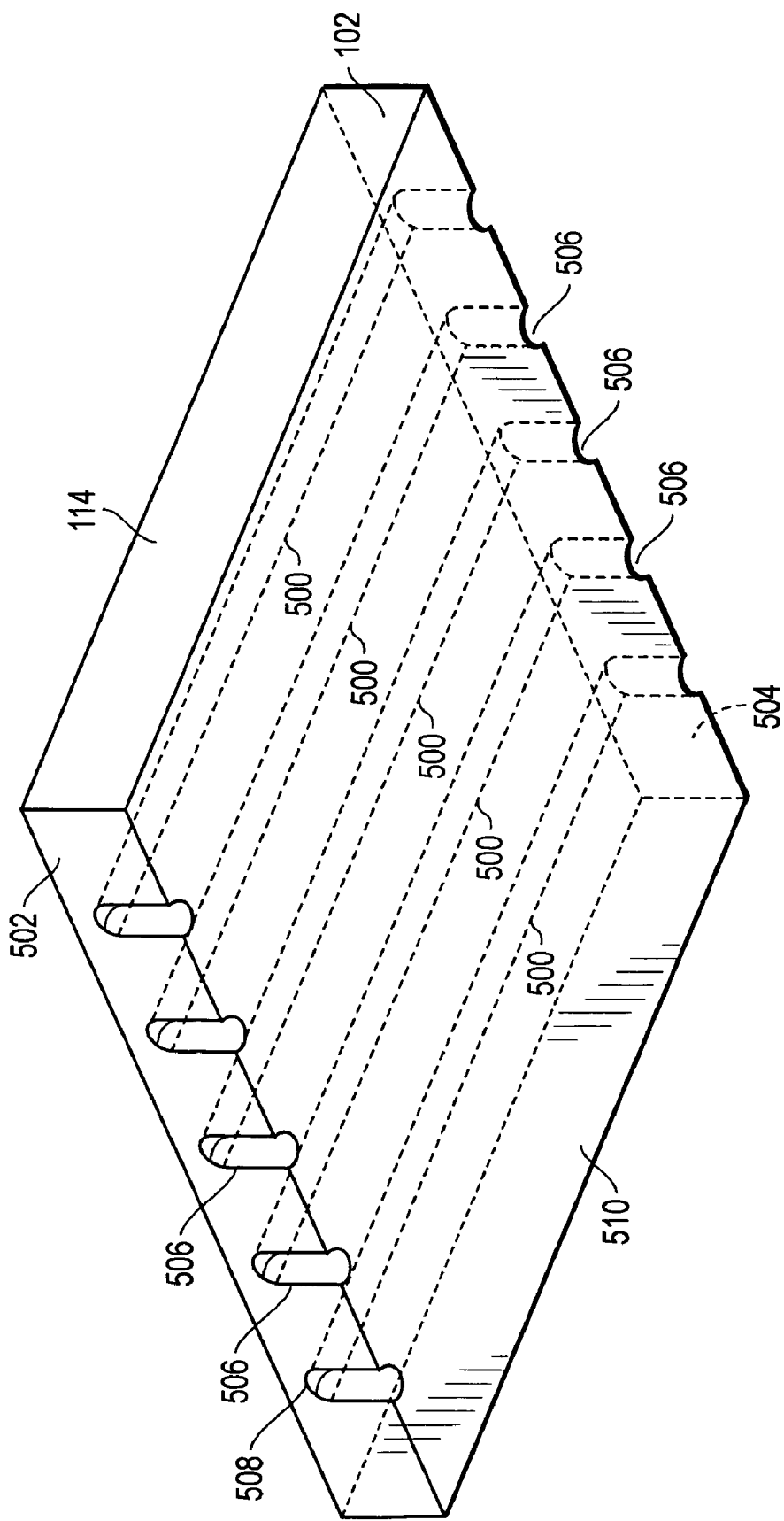
FIG. 5 sets forth a perspective view of a further exemplary heat sink base useful in a heat sink for dissipating a thermal load according to embodiments of the present invention.

For further explanation, FIG. 5 sets forth a perspective view of a further exemplary heat sink base (102) useful in a heat sink for dissipating a thermal load according to embodiments of the present invention. The heat sink base (102) in the example of FIG. 5 is implemented as a top plate (114). In the example of FIG. 5, the top plate (114) includes upper heat pipe tunnels (500). The upper heat pipe tunnels (500) receive heat pipes through the top plate (114). In the example of FIG. 5, the heat-dissipating fins are omitted for explanation and clarity.

In the example of FIG. 5, upper heat pipe tunnels (500) are circular tunnels that extend through the top plate (114) from the left surface (502) of the top plate (114) to the right surface (504) of the top plate (114). The diameters of the upper heat pipe tunnels (500) conform to the diameters of the heat pipes received by the upper heat pipe tunnels (500). In the example of FIG. 5, the upper heat pipe tunnels (500) are spaced equally apart in parallel.

The example of FIG. 5 also includes semicircular cavities (506) along the left surface (502) of the top plate (114) and along the right surface (504) of the top plate (114). The diameters of the semicircular cavities (506) conform to the diameters of the upper heat pipe tunnels (500). Each semicircular cavity (506) intersects one of the upper heat pipe tunnels (500). In the example of FIG. 5, each semicircular cavity (506) extends from the top (508) of an upper heat pipe tunnel (500) to the lower surface (510) of the top plate (114).

Figure 6:
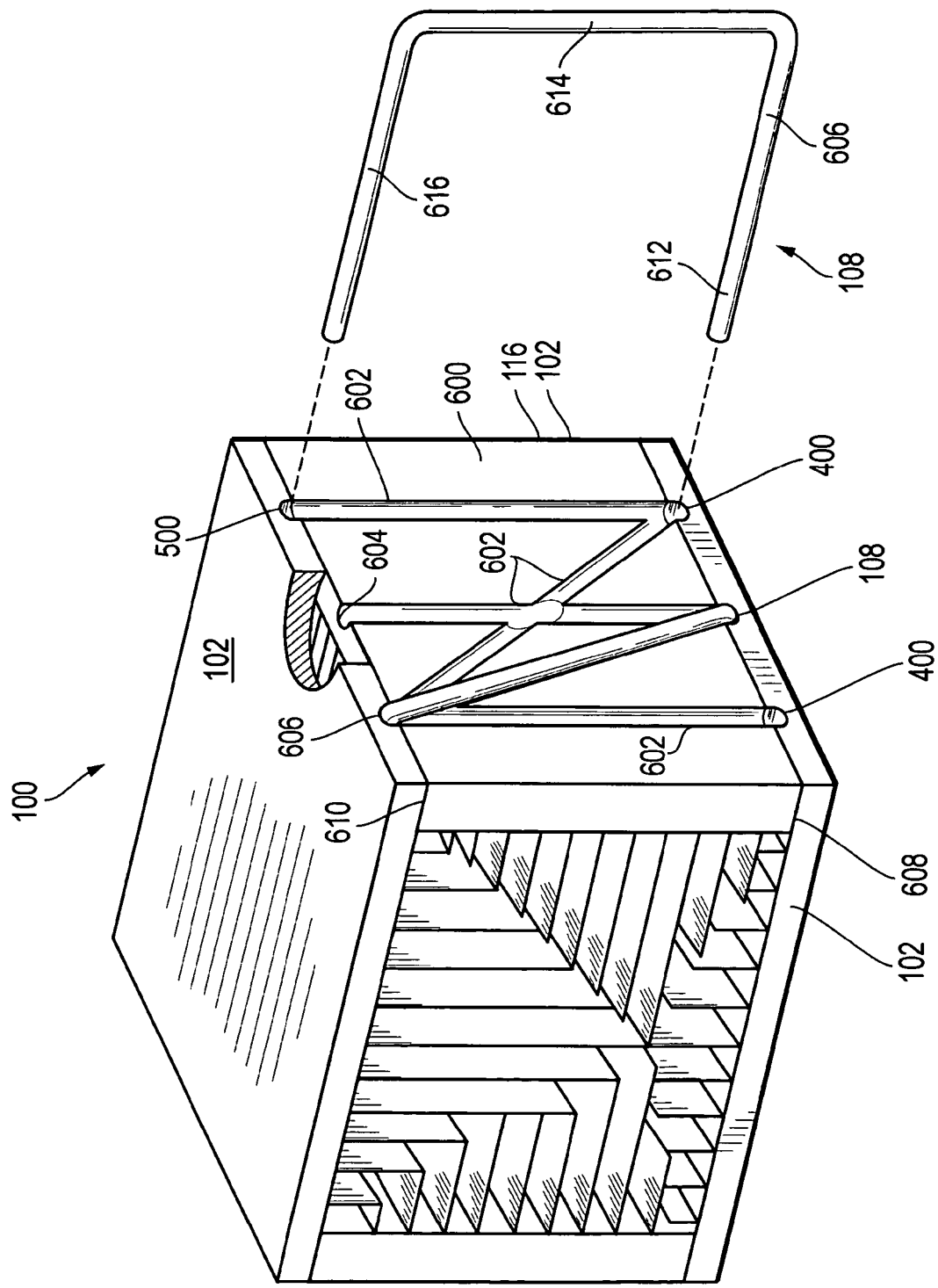
FIG. 6 sets forth a perspective view of a further exemplary heat sink for dissipating a thermal load according to embodiments of the present invention.

For further explanation, FIG. 6 sets forth a perspective view of a further exemplary heat sink (100) for dissipating a thermal load according to embodiments of the present invention. The exemplary heat sink (100) of FIG. 6 includes one or more heat sink bases (102) and thermal transports (108). The one or more heat sink bases (102) in the example of FIG. 6 include a right plate (116). The right plate (116) includes a right outer surface (600). The right plate (116) also includes heat pipe channels (602) along the right outer surface (600). Each heat pipe channel (602) includes a semicircular cavity (604) longitudinally extending from one of the lower heat pipe tunnels (400) to one of the upper heat pipe tunnels (500). Each thermal transport (108) in the example of FIG. 6 is implemented as a heat pipe (606) connected between one of the lower heat pipe tunnels (400), one of the heat pipe channels (602), and one of the upper heat pipe tunnels (500) so as to distribute the thermal load in the heat sink (100).

In the example of FIG. 6, the heat pipe channels (602) are semicircular cavities (604) along the right outer surface (600) that extend in length from the bottom surface (608) of the right plate (116) to the top surface (610) of the right plate (116). Each heat pipe channel (602) intersects the bottom surface (608) of the right plate (116) at a location adjacent to one of the lower heat pipe tunnels (400). Each heat pipe channel (602) also intersects the top surface (610) of the right plate (116) at a location adjacent to one of the upper heat pipe tunnels (500). The diameters of the heat pipe channels (602) in the example of FIG. 6 conform to the diameters of the lower heat pipe tunnels (400) and the upper heat pipe tunnels (500).

In the example of FIG. 6, each heat pipe (606) is a closed evaporator-condenser system consisting of a sealed, hollow tube whose inside walls are lined with a capillary structure, also referred to as a 'wick.' A thermodynamic working fluid having substantial vapor pressure at the desired operating temperature saturates the pores of the wick. The fluid heats and evaporates when heat is applied to a region of the heat pipe (606). As the evaporating fluid fills the hollow center of the wick, the vapor diffuses throughout the heat pipe (606). The vapor condenses in the heat pipe (606) wherever the temperature along the heat pipe (606) falls below the temperature of the evaporation area. As the vapor condenses, the vapor releases the heat that the vapor acquired during evaporation. Capillary action within the wick returns the condensate to the evaporation area and completes the operating cycle.

In the example of FIG. 6, each heat pipe (606) is connected between one of the lower heat pipe tunnels (400), one of the heat pipe channels (602), and one of the upper heat pipe tunnels (500) so as to distribute the thermal load in the heat sink (100). Each heat pipe (606) in the example of FIG. 6 includes a bottom section (612) that inserts into the lower heat pipe tunnel (400). The heat pipe (606) also includes a lateral section (614) adjacent to the bottom section (612). The lateral section (614) of the heat pipe (606) connects with the inner surface of the heat pipe channel (602). The heat pipe (606) further includes a top section (616) adjacent to the lateral section (614). The top section (616) of the heat pipe (606) inserts into the upper heat pipe tunnel (500).

In the example of FIG. 6, each heat pipe (606) is connected between one of the lower heat pipe tunnels (400), one of the heat pipe channels (602), and one of the upper heat pipe tunnels (500) by a press-fit connection. Such a press-fit connection is for example only, and not for limitation. The heat pipe (606) may also connect between one of the lower heat pipe tunnels (400), one of the heat pipe channels (602), and one of the upper heat pipe tunnels (500) by fastening mechanism such as, for example, a clip, a screw, or an adhesive.

Figure 7:
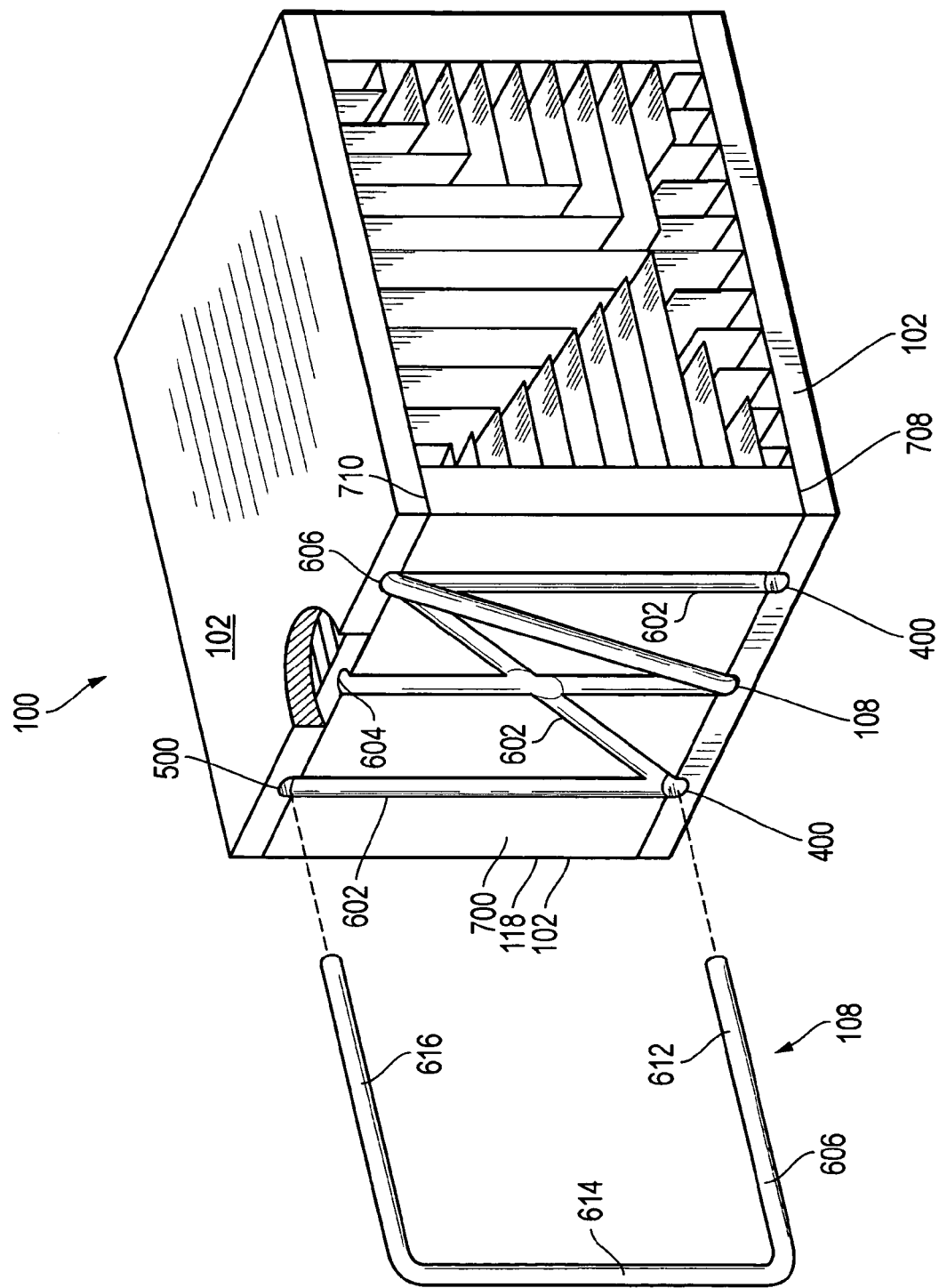
FIG. 7 sets forth a perspective view of a further exemplary heat sink for dissipating a thermal load according to embodiments of the present invention.

For further explanation, FIG. 7 sets forth a perspective view of a further exemplary heat sink (100) for dissipating a thermal load according to embodiments of the present invention. The exemplary heat sink (100) of FIG. 7 includes one or more heat sink bases (102) and thermal transports (108). The one or more heat sink bases (102) in the example of FIG. 7 include a left plate (118). The left plate (118) includes a left outer surface (700). The left plate (118) also includes heat pipe channels (602) along the left outer surface (700). Each heat pipe channel (602) includes a semicircular cavity (604) longitudinally extending from one of the lower heat pipe tunnels (400) to one of the upper heat pipe tunnels (500). Each thermal transport (108) in the example of FIG. 7 is implemented as a heat pipe (606) connected between one of the lower heat pipe tunnels (400), one of the heat pipe channels (602), and one of the upper heat pipe tunnels (500) so as to distribute the thermal load in the heat sink (100).

In the example of FIG. 7, the heat pipe channels (602) are semicircular cavities (604) along the left outer surface (700) that extend in length from the bottom surface (708) of the left plate (118) to the top surface (710) of the left plate (118). Each heat pipe channel (602) intersects the bottom surface (708) of the left plate (118) at a location adjacent to one of the lower heat pipe tunnels (400). Each heat pipe channel (602) also intersects the top surface (710) of the left plate (118) at a location adjacent to one of the upper heat pipe tunnels (500). The diameters of the heat pipe channels (602) in the example of FIG. 7 conform to the diameters of the lower heat pipe tunnels (400) and the upper heat pipe tunnels (500).

In the example of FIG. 7, each heat pipe (606) is connected between one of the lower heat pipe tunnels (400), one of the heat pipe channels (602), and one of the upper heat pipe tunnels (500) so as to distribute the thermal load in the heat sink (100). Each heat pipe (606) in the example of FIG. 7 includes a bottom section (612) that inserts into the lower heat pipe tunnel (400). The heat pipe (606) also includes a lateral section (614) adjacent to the bottom section (612). The lateral section (614) of the heat pipe (606) connects with the inner surface of the heat pipe channel (602). The heat pipe (606) further includes a top section (616) adjacent to the lateral section (614). The top section (616) of the heat pipe (606) inserts into the upper heat pipe tunnel (500).

In the example of FIG. 7, each heat pipe (606) is connected between one of the lower heat pipe tunnels (400), one of the heat pipe channels (602), and one of the upper heat pipe tunnels (500) by a press-fit connection. Such a press-fit connection is for example only, and not for limitation. The heat pipe (606) may also connect between one of the lower heat pipe tunnels (400), one of the heat pipe channels (602), and one of the upper heat pipe tunnels (500) by fastening mechanism such as, for example, a clip, a screw, or an adhesive.

Although readers will recognize from FIGS. 1-7 that heat sinks for dissipating a thermal load according to embodiments of the present invention may include four heat sink bases, not all heat sinks for distributing a thermal load according to embodiments of the present invention include four heat sink bases. For further explanation of a heat sink that includes two heat sink bases, FIG. 8 sets forth a perspective view of a further exemplary heat sink (100) for dissipating a thermal load according to embodiments of the present invention. The example heat sink (100) of FIG. 8 includes one or more heat sink bases (102) configured around a central axis (104) of the heat sink so as to define an interior space (106). At least one heat sink base (102) receives the thermal load from an integrated circuit package (128).

Figure 8:
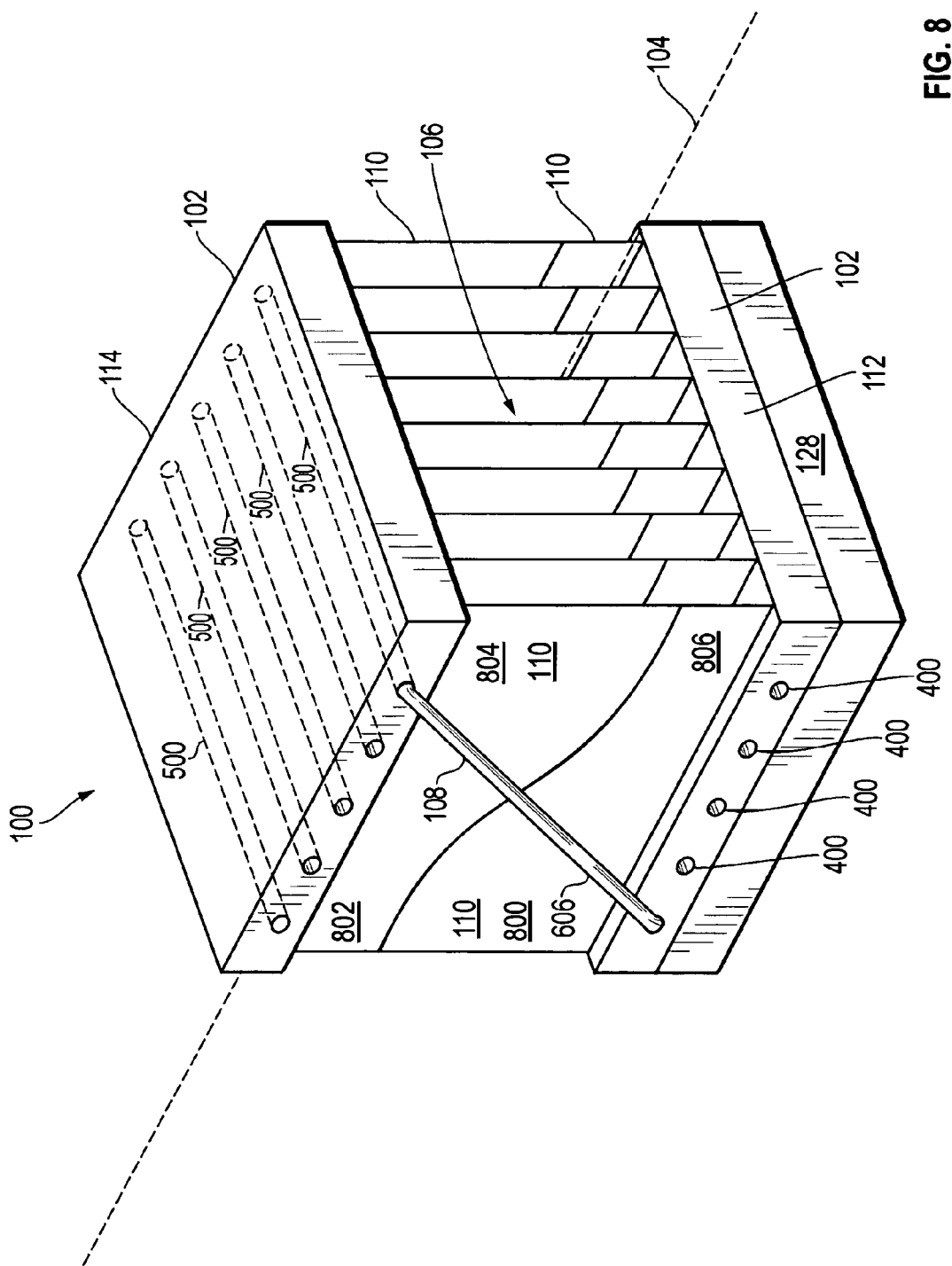
FIG. 8 sets forth a perspective view of a further exemplary heat sink for dissipating a thermal load according to embodiments of the present invention.

In the example of FIG. 8, the one or more heat sink bases (102) include only a bottom plate (112) and a top plate (114). The plates are connected and oriented around the central axis (104) of the heat sink (100) so as to define the interior space (106) as a rectangular box shape with two closed sides and four open sides. The bottom plate (112) connects to an integrated circuit package (128) to receive the thermal load for distribution in the heat sink (100). In the example of FIG. 8, the bottom plate (112) includes lower heat pipe tunnels (400), and the top plate (114) includes upper heat pipe tunnels (500).

The example heat sink (100) of FIG. 8 also includes a thermal transport (108) connected to the at least one heat sink base (102) receiving the thermal load so as to distribute the thermal load in the heat sink (100). In the example of FIG. 8, the thermal transport (108) is implemented as a heat pipe (606) connected between one of the lower heat pipe tunnels (400) and one of the upper heat pipe tunnels (500) so as to distribute the thermal load in the heat sink (100).

The example heat sink (100) of FIG. 8 also includes heat-dissipating fins (110) connected to each heat sink base (102). The heat-dissipating fins (110) extend from each heat sink base (102) into the interior space (106) of the heat sink. In the example of FIG. 8, the heat-dissipating fins (110) connect to each heat sink base (102) by extrusion from the heat sink base (102). As mentioned above, extruded heat-dissipating fins are for explanation, and not for limitation. The heat-dissipating fins (110) may also connect to each heat sink base (102) by bonding the fins (110) to the heat sink base (102) through the use of epoxy, brazing, or welding. In the example of FIG. 8, the bottom plate (112) and the top plate (114) connect through heat-dissipating fins (110). The heat-dissipating fins (110) connected to the bottom plate (112) connect to the heat-dissipating fins (110) connected to the top plate (114).

In the example of FIG. 8, each heat-dissipating fin (110) is shaped according to the location of the heat-dissipating fin with respect to the location of the thermal load and the location of the distributed thermal load in the heat sink. In the example of FIG. 8, each heat-dissipating fin (110) connected to the bottom plate (112) has the same relationship between the location of the heat-dissipating fin (110), the location of the thermal load, and the location of the distributed thermal load. Similarly, each heat-dissipating fin (110) connected to the top plate (114) has the same relationship between the location of the heat-dissipating fin (110), the location of the thermal load, and the location of the distributed thermal load. In the example of FIG. 8, the integrated circuit package (128) produces a thermal load adjacent to the back region (800) of each heat-dissipating fin (110) connected to the bottom plate (112), while the distributed thermal load is located adjacent to the front region (804) of each heat-dissipating fin (110) connected to the top plate (114). In the example of FIG. 8, therefore, each heat-dissipating fin (110) connected to the bottom plate (112) is shaped to have more surface area in the back region (800) than the back region (802) of each heat-dissipating fin (110) connected to the top plate (114). In a similar manner, each heat-dissipating fin (110) connected to the top plate (114) is shaped to have more surface area in the front region (804) than the front region (806) of each heat-dissipating fin (110) connected to the bottom plate (112).

Figure 9:
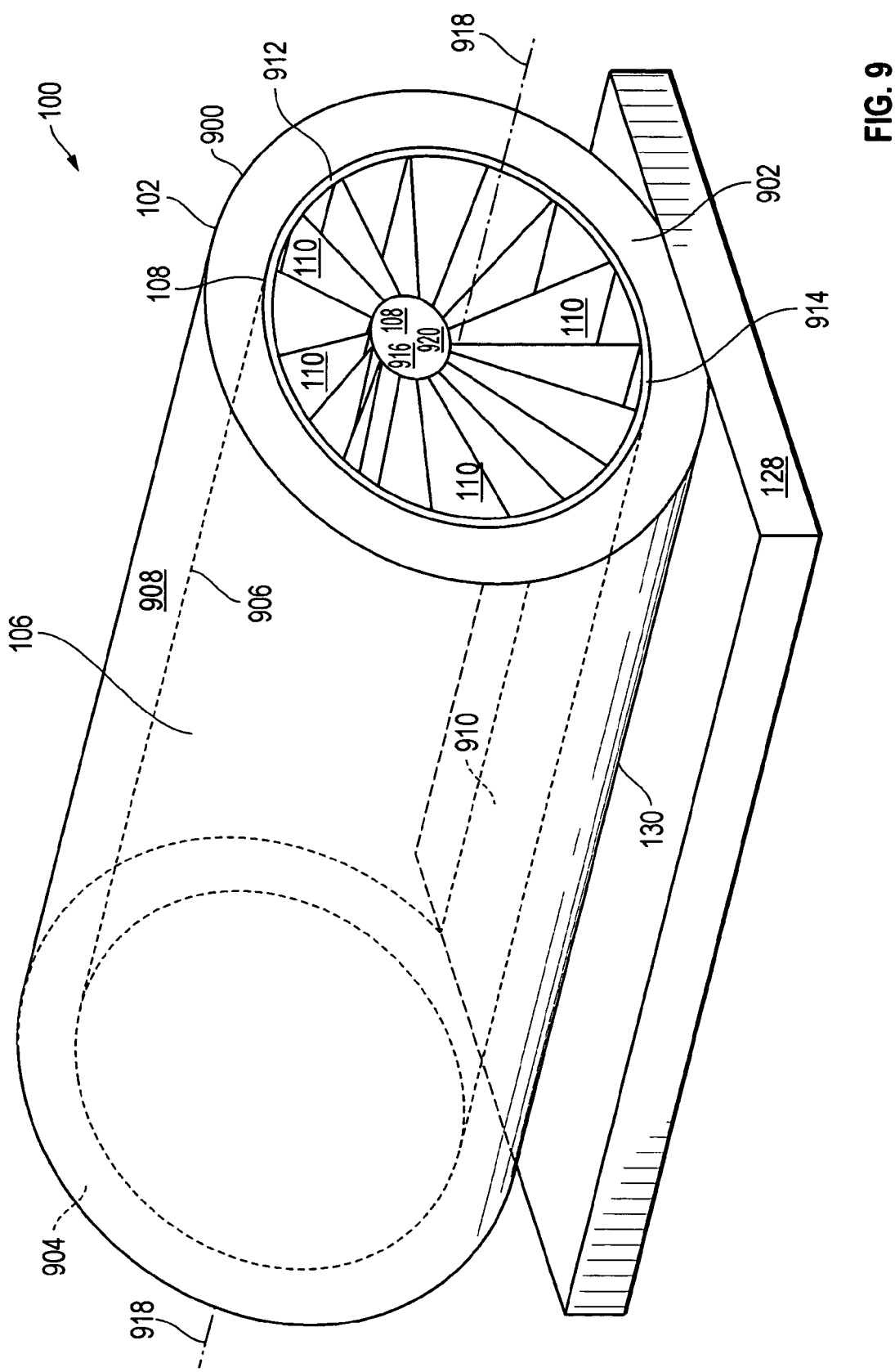
FIG. 9 sets forth a perspective view of a further exemplary heat sink for dissipating a thermal load according to embodiments of the present invention.

For further explanation of a heat sink that includes one heat sink base, FIG. 9 sets forth a perspective view of a further exemplary heat sink (100) for dissipating a thermal load according to embodiments of the present invention. The example heat sink (100) of FIG. 9 includes one heat sink base (102) configured around a central axis (not shown) of the heat sink so as to define an interior space (106). The one heat sink base (102) receives the thermal load from an integrated circuit package (128). In the example of FIG. 9, the one heat sink base (102) is implemented as a cylindrical base (900) receiving the thermal load. The cylindrical base (900) has a front surface (902), a back surface (904), an inner surface (906), and an outer surface (908). The outer surface (908) is shaped generally as a cylinder and has a flat mounting region (910). The inner surface (906) is shaped as a cylinder so as to define the interior space (106) as a cylinder with two open ends. In the example of FIG. 9, the front surface (902) is parallel to the back surface (904). The front surface (902) and the back surface (904) are perpendicular to a line intersecting the centers of the front surface (902) and the back surface (904).

In the example of FIG. 9, the inner surface (906) of the cylindrical base (900) may be created by boring a hollowed region through the cylindrical base (900) along an axis (918) shifted upward so as to be off-centered from the central axis (not shown) of the cylindrical base (900). The hollowed region extends from the front surface (902) to the back surface (904) such that the central axis (918) of the hollowed region is perpendicular to the front surface (902) and the back surface (904). The walls of the hollowed region form the inner surface (906). The inner surface (906) is shaped as a cylinder so as to define the interior space (106) for receiving a cylindrical thermal transport (912), heat-dissipating fins (110), and an axial thermal transport (916).

In the example of FIG. 9, the flat mounting region (910) is formed from a rounded portion of the outer surface (908) by milling a rounded portion of the outer surface (908) flat. The flat mounting region (910) of the outer surface (908) connects to the integrated circuit package (128) by a thermal interface (130). The thermal interface (130) in the example of FIG. 9 may include non-adhesive materials such as, for example, thermal greases, phase change materials, and gap-filling pads. The thermal interface (130) may also include adhesive materials such as, for example, thermosetting liquids, pressure-sensitive adhesive ('PSA') tapes, and thermoplastic or thermosetting bonding films.

The example heat sink (100) of FIG. 9 also includes a thermal transport (108) connected to the at least one heat sink base (102) receiving the thermal load so as to distribute the thermal load in the heat sink (100). In the example of FIG. 9, the thermal transport (108) includes a cylindrical thermal transport (912) connected to the inner surface (906) of the cylindrical base (900) so as to distribute the thermal load in the heat sink (100). The cylindrical thermal transport (912) is a heat transfer mechanism that transports thermal energy from one region along the cylindrical thermal transport (912) to another region along the cylindrical thermal transport (912) with a minimal loss of thermal energy. Such cylindrical thermal transports have an efficiency that approximates a closed thermal transfer system. Examples of cylindrical thermal transports include heat pipes and carbon nanotubes.

The cylindrical thermal transport (912) in the example of FIG. 9 is implemented as a flat heat pipe (914) configured as a cylindrical tube. A flat heat pipe is a closed evaporator-condenser system consisting of a sealed, flat, hollow plate whose inside walls are lined with a capillary structure. Flat heat pipes operating in a manner similar to the heat pipes described above. In the example of FIG. 9, the flat heat pipe (914) is implemented as a relatively thin lining along the inner surface (906) of the cylindrical base (900). The thickness of typical flat heat pipes useful in heat sinks according to embodiments of the present invention may range from approximately 1.2 millimeters to 2.0 millimeters in thickness. Such a range of thickness is for example only and not for limitation. Other thicknesses as will occur to those of skill in the art may be useful in heat sinks for distributing a thermal load according to embodiments of the present invention. The flat heat pipe (914) in the example of FIG. 9 is bent to form a cylindrical tube with a diameter that conforms to the diameter of the interior space (106). The flat heat pipe (914) extends in length from the front surface (902) of the cylindrical base (900) to the back surface (904) of the cylindrical base (900). The flat heat pipe (914) connects to the inner surface (906) by a press-fit connection. Such a press-fit connection is for example only, and not for limitation. The flat heat pipe (914) may also connect to the inner surface (906) by a fastening mechanism such as, for example, a clip, an adhesive, or a thermal interface.

The example heat sink (100) of FIG. 9 includes heat-dissipating fins (110) connected to the heat sink base (102). The heat-dissipating fins (110) extend from each heat sink base (102) into the interior space (106) of the heat sink. In the example of FIG. 9, the heat-dissipating fins (110) connect to the cylindrical base (900) through the cylindrical thermal transport (912) and extend from the cylindrical thermal transport (912) into the interior space (106) of the heat sink (100). Each heat-dissipating fin (110) is shaped according to the location of the heat-dissipating fin with respect to the location of the thermal load and the location of the distributed thermal load in the heat sink. In the example of FIG. 9, each heat-dissipating fin (110) has the same relationship between the location of the heat-dissipating fin (110) and the location of the distributed thermal load because the cylindrical thermal transport (912) evenly distributes the thermal load generated by the integrated circuit package (128) along the inner surface (906) of the cylindrical base (900). Each heat-dissipating fin (110) does not, however, have the same relationship between the location of the heat-dissipating fin (110) and the location of the thermal load because the heat-dissipating fin (110) in the bottom region of the interior space (106) are closer to the thermal load than the heat-dissipating fin (110) in the top region of the interior space (106). In the example of FIG. 9, therefore, the heat-dissipating fins (110) in the bottom region of the interior space (106) are shaped to have more surface area than the heat-dissipating fins (110) in the top region of the interior space (106).

In the example of FIG. 9, the heat-dissipating fins (110) extend in length from the front surface (902) of the cylindrical base (900) to the back surface (904) of the cylindrical base (900). The heat-dissipating fins (110) extend in height from the inner surface of the cylindrical thermal transport (912) for a distance that provides the capability of inserting an axial thermal transport (916) into the interior space (106) along an axis of the interior space (106). The heat-dissipating fins (110) connect to the cylindrical thermal transport (912) by a press-fit connection. Such a press-fit connection is for example only, and not for limitation. The heat-dissipating fins (110) may also connect to the cylindrical thermal transport (912) by a fastening mechanism such as, for example, a clip, an adhesive or a thermal interface. The number of heat-dissipating fins (110) in the example of FIG. 9 connected to the cylindrical thermal transport (912) may be limited by the height-to-gap aspect ratio of the fins (110). Typical height-to-gap aspect ratios for the bonded press-fit heat-dissipating fins (110) in the example of FIG. 9 range from 20 to 40. In the example of FIG. 9, the heat-dissipating fins (110) may be formed by folding a rectangular piece of sheet metal multiple times along opposite sides and shaping the folded sheet metal to as a cylinder for insertion into the interior space (106). The heat-dissipating fins (110) may also be formed by inserting separate rectangular metal sheets into the interior space (106) along guides connected to the front surface (902) of the cylindrical base (900) and the back surface (904) of the cylindrical base (900).

In the example of FIG. 9, the thermal transport (108) of the example heat sink (100) also includes an axial thermal transport (916) extending along an axis (918) of the interior space (106). The axial thermal transport (916) connects to the heat-dissipating fins (110) so as to distribute the thermal load in the heat sink (100). The axial thermal transport (916) is a heat transfer mechanism that transports thermal energy from one region along the axial thermal transport (916) to another region along the axial thermal transport (916) with a minimal loss of thermal energy. Such axial thermal transports have an efficiency that approximates a closed thermal transfer system. Examples of axial thermal transports include heat pipes and carbon nanotubes. In the example of FIG. 1, the axial thermal transport (916) is implemented as a heat pipe (920). The heat pipe (920) extends in length from the front surface (902) of the cylindrical base (900) to the back surface (904) of the cylindrical base (900). In the example of FIG. 1, the heat pipe (920) connects to the heat-dissipating fins (110) by a press-fit connection. Such a press-fit connection is for example only, and not for limitation. The heat pipe (290) may also connect to the heat-dissipating fins (110) by a fastening mechanism such as, for example, a clip, an adhesive, or a thermal interface.

Although FIG. 9 depicts the axial thermal transport (916) connected to the heat-dissipating fins so as to distribute the thermal load in the heat sink (100), the axial thermal transport (916) may also connect to the cylindrical base (900) adjacent to the thermal load. Moreover, the axial thermal transport (916) may also connect to the cylindrical thermal transport (912). The ends of axial thermal transport (916) may be connected to the cylindrical thermal transport (912) by extending outside of the interior space (106) and fastening to the cylindrical thermal transport (912). The axial thermal transport (916) may also be connected to the cylindrical thermal transport (912) by a thermal transport, such as, for example, a flat heat pipe, configured as a fin extending from the cylindrical thermal transport (912) to the axial thermal transport (916). The thermal transport configured as a fin may be a separate thermal transport from the cylindrical thermal transport (912) and the axial thermal transport (916) or the thermal transport configured as a fin may be integrated into the cylindrical thermal transport (912) or the axial thermal transport (916).

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A heat sink for dissipating a thermal load, the heat sink comprising:
    a plurality of heat sink bases configured around a central axis of the heat sink so as to define an interior space, at least one heat sink base receiving the thermal load, wherein the interior space of the heat sink forms a rectangular box shape with four closed sides and two open sides;
    a thermal transport connected to the at least one heat sink base receiving the thermal load so as to distribute the thermal load in the heat sink; and
    heat-dissipating fins connected to each heat sink base, the heat-dissipating fins extending from each heat sink base into the interior space of the heat sink, each heat-dissipating fin shaped according to the location of the heat-dissipating fin with respect to the location of the thermal load and the location of the distributed thermal load in the heat sink, wherein a plurality of the heat-dissipating fins are located differently with respect to the location of the thermal load or the location of the distributed thermal load
    wherein:
    the plurality of heat sink bases further comprises a bottom plate, a top plate, a right plate, and a left plate, the plates connected along edges and oriented around the central axis of the heat sink, the bottom plate receiving the thermal load;
    the bottom plate further comprises lower heat pipe tunnels;
    the top plate further comprises upper heat pipe tunnels;
    the right plate further comprises a right outer surface and heat pipe channels along the right outer surface, each heat pipe channel comprising a semicircular cavity longitudinally extending from one of the lower heat pipe tunnels to one of the upper heat pipe tunnels; and
    the left plate further comprises a left outer surface and heat pipe channels along the left outer surface, each heat pipe channel comprising a semicircular cavity longitudinally extending from one of the lower heat pipe tunnels to one of the upper heat pipe tunnels.

2. The heat sink of claim 1 wherein the thermal transport further comprises a heat pipe connected between one of the lower heat pipe tunnels, one of the heat pipe channels, and one of the upper heat pipe tunnels so as to distribute the thermal load in the heat sink.

* * * * *